US00RE50260E

(19) United States
(12) Reissued Patent
Khan et al.

(10) Patent Number: US RE50,260 E
(45) Date of Reissued Patent: Jan. 7, 2025

(54) THIN FILM DIAMOND COATING SYSTEM AND METHOD

(71) Applicant: AKHAN Semiconductor, Inc., Gurnee, IL (US)

(72) Inventors: Adam Khan, Tiburon, CA (US); Robert Polak, Lindenhurst, IL (US)

(73) Assignee: AKHAN SEMICONDUCTOR, INC., Gurnee, IL (US)

(21) Appl. No.: 17/900,464

(22) Filed: Aug. 31, 2022

Related U.S. Patent Documents

Reissue of:
(64) Patent No.: 10,760,157
Issued: Sep. 1, 2020
Appl. No.: 15/673,381
Filed: Aug. 9, 2017

U.S. Applications:
(60) Provisional application No. 62/372,343, filed on Aug. 9, 2016.

(51) Int. Cl.
*C23C 16/27* (2006.01)
*C03C 17/22* (2006.01)
*C03C 17/245* (2006.01)

(52) U.S. Cl.
CPC ..... *C23C 16/271* (2013.01); *C03C 17/22* (2013.01); *C03C 17/245* (2013.01); *C23C 16/274* (2013.01); *C03C 2217/28* (2013.01); *C03C 2217/78* (2013.01); *C03C 2218/153* (2013.01)

(58) Field of Classification Search
CPC ... C03C 17/22; C03C 17/245; C03C 2217/28; C03C 2218/153; C03C 2217/78; C23C 16/274; C23C 16/271
See application file for complete search history.

(56) References Cited

U.S. PATENT DOCUMENTS 5,308,661 A * 5/1994 Feng ..... C23C 16/0272 423/446
5,989,511 A * 11/1999 Gruen ..... C23C 14/0605 423/446
6,159,604 A * 12/2000 Adachi ..... C01B 32/28 423/446
7,128,889 B2 * 10/2006 Carlisle ..... C23C 16/274 423/446
8,497,513 B2 * 7/2013 Kohn ..... G01N 27/414 257/77
2005/0031785 A1 * 2/2005 Carlisle ..... C23C 16/274 428/408
2005/0095429 A1 * 5/2005 Reinhard ..... C23C 16/01 428/408

(Continued)

*Primary Examiner* — Christina Y. Leung
(74) *Attorney, Agent, or Firm* — David R. Stevens; Stevens Law Group

(57) ABSTRACT

Disclosed herein is a transparent glass system that includes an optical grade silicon substrate, and a nanocrystalline diamond film on the silicon substrate, the diamond film deposited using a chemical vapor deposition system having a reactor in which methane, hydrogen and argon source gases are added. Further disclosed is a method of fabricating transparent glass that includes the steps of seeding an optical grade silicon substrate and forming a nanocrystalline diamond film on the silicon substrate using a chemical vapor deposition system having a reactor in which methane, hydrogen and argon source gases are added.

13 Claims, 3 Drawing Sheets

(56) References Cited

U.S. PATENT DOCUMENTS

| | | | | |
|---|---|---|---|---|
| 2014/0063597 | A1* | 3/2014 | Shimmo | G02B 5/208 359/359 |
| 2014/0220327 | A1* | 8/2014 | Adib | C03C 17/3435 428/217 |
| 2015/0218694 | A1* | 8/2015 | Xu | C23C 28/04 428/206 |
| 2016/0018576 | A1* | 1/2016 | Yamamoto | G03B 11/00 359/359 |
| 2016/0064500 | A1* | 3/2016 | Chen | H01L 21/31122 257/315 |
| 2017/0011914 | A1* | 1/2017 | Sumant | C23C 16/511 |

* cited by examiner

THIN FILM DIAMOND COATING SYSTEM AND METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

*More than one reissue application has been filed for the reissue of U.S. Pat. No. 10,760,157. The reissue applications are application Ser. Nos. 17/900,464 (the present application), and 17/900,534, all of which are reissues of U.S. Pat. No. 10,760,157.*

This application claims the benefit of U.S. Provisional Application No. 62/372,343, filed Aug. 9, 2016, which is fully incorporated herein by reference.

BACKGROUND

Field

This invention is generally related to systems and methods for transparent diamond electronics, and more particularly to a system and method for providing thin film diamond coatings for transparent component materials.

Background

Diamond possesses favorable theoretical semiconductor performance characteristics, including the possibility of creating transparent electronics, including those related to consumer electronic component materials, such as display and lens materials. These applications often include more stringent design requirements, such as increased hardness, scratch resistance, and water resistance. However, practical diamond based semiconductor device applications for consumer electronic component materials remain limited.

SUMMARY

Disclosed herein is a new and improved system and method for providing thin film diamond coatings for transparent component materials. In accordance with one aspect of the approach, a transparent glass system may include an optical grade silicon substrate, and a nanocrystalline diamond film on the silicon substrate, the diamond film deposited using a chemical vapor deposition system having a reactor in which methane, hydrogen and argon source gases are added.

In another approach, a method of fabricating transparent glass may include the steps of seeding an optical grade silicon substrate and forming a nanocrystalline diamond film on the silicon substrate using a chemical vapor deposition system having a reactor in which methane, hydrogen and argon source gases are added.

Other systems, methods, aspects, features, embodiments and advantages of the system and method disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the system disclosed herein. In the figures, like reference numerals designate corresponding parts throughout the different views.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The system and method provided herein allow for the fabrication of an improved glass component system with respect to hardness, strength, and hydrophobic design requirements, while optimizing for transmissivity and reflectance requirements in the visible wavelengths. Further, deposition of thin film nanocrystalline diamond may occur at complementary metal-oxide-semiconductor (CMOS) compatible temperatures, for example, at temperatures less than 450 degrees Celsius. Deposition at such temperatures may provide a low strain, high crystalline quality diamond layer that can be efficiently integrated with a variety of optical materials such as, but not limited to, fused silica glass, sapphire, and quartz.

Figure 1:
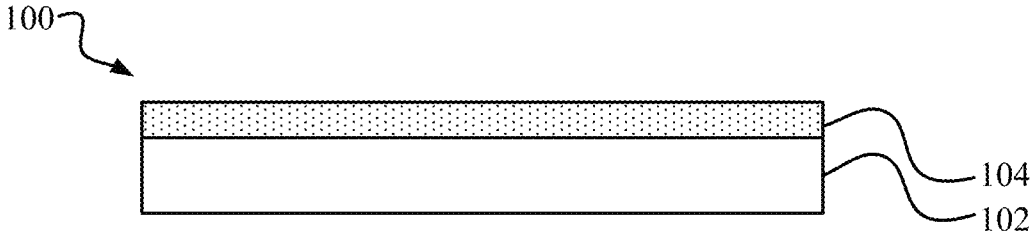
FIG. 1 is an exemplary schematic diagram of a thin film diamond coatings for transparent component materials.

FIG. 1 shows an exemplary schematic diagram of a thin film diamond coatings for transparent component materials structure 100. Structure 100 may include a substrate 102 and a diamond film 104. Substrate 102 may be an optical grade substrate, such as, but not limited to an optical grade silicon substrate, fused silica, sapphire, quartz, crown glass, borosilicate glass, Fresnel, and BK7. Such glasses as BK7 are known to those having skill in the art. Substrate 102 may include consumer electronics display and lens materials. Although various embodiments may include varying thickness layers, in some embodiments considered herein, the diamond film layer is 10 nanometers) and 113.6 nm. In another embodiment, the thickness of the layers may vary by plus or minus 10 percent of the thicknesses provided immediately above. In another embodiment, the thickness of the layers may vary by plus or minus 5 percent of the thicknesses provided immediately above.

Figure 2:
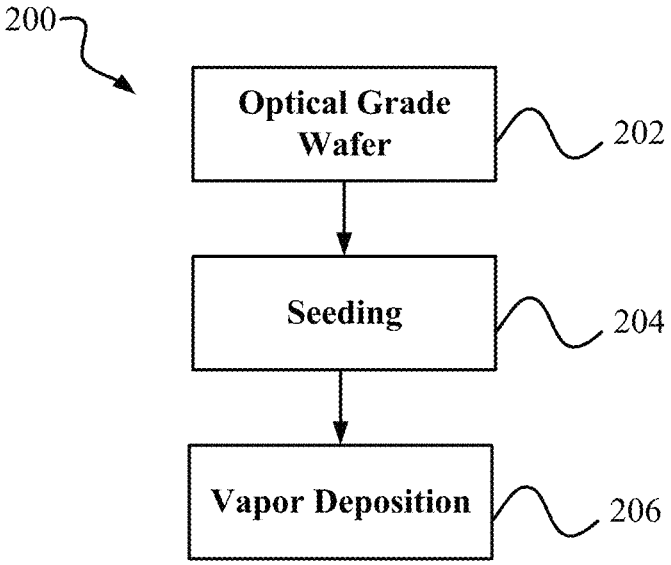
FIG. 2 is an exemplary block diagram of an embodiment of a method for fabricating thin film diamond coatings for transparent component materials, such as the structure of FIG. 1.

FIG. 2 shows an exemplary block diagram of an embodiment of a method 200 for fabricating thin film diamond coatings for transparent component materials, such as structure 100. Fabrication of such a system can be realized utilizing a combination of techniques, including chemical vapor deposition.

Method 200 may include a first step 202 of selecting an optical substrate, such as an optical grade substrate, for example, substrate 102. Method 200 may include a second step 204 of seeding the substrate, for example seeding substrate 102. The substrate may be seeded with an ultra-small grain nanocrystalline diamond solution, for example, less than 10 nanometer particulate size. The seeded material may be subjected to an alcohol mixture and ultra-soniced to promote uniform seeding and film agglomeration. The seeded substrate may then be dried, for example, using an air gun.

Method 200 may include a third step 206 of chemical vapor deposition growth upon the substrate, for example substrate 102 may be subjected to a chemical vapor deposition growth process. In step 206, the seeded substrate material may be loaded into a chemical vapor deposition system. The chemical vapor deposition system reactor may be pressurized to 120 mbar and processed for thin film diamond growth utilizing, for example, the following source gases and concentrations: 300 SCCM argon, 3 SCCM CH4 (methane), 4 SCCM H2 (hydrogen).

If a microwave plasma chemical vapor deposition is employed in step 206, the deposition system may be set at 6.5 kilowatts of power is at, for example, 915 Megahertz and/or 2.45 Gigahertz with diamond growth proceeding on average at approximately one micron thickness per hour. Growth temperature may be regulated in all chemical vapor deposition systems to operate at temperatures less than 450 degrees Celsius using the applied power and stage heating in the case of microwave plasma reactors, and through increasing hot filament distancing relative to the growth surface, for example, but not limited to changing the distance from 2 to 3.5 inches, while adjusting the vacuum pressure in the case of hot filament reactors, for example, but not limited to, from 5 torr to ultrahigh vacuum.

Microwave plasma and hot filament chemical vapor deposition reactors may be used in step 206, optimizing the reactors for the parameters of power, chamber size, temperature, pressure, and in the case of microwave, plasma frequency. For example, for higher growth rates over areas of four inches and less, a microwave plasma system operating at 2.45 Gigahertz may provide high crystalline quality materials, whereas at 915 Megahertz, larger chamber sizes may be utilized providing uniform high-quality growth over substrate sizes of eight inches and less. Further, utilizing hot filament chemical vapor deposition systems, moderate growth and quality can be achieved over areas of twelve inches and less.

Figure 3:
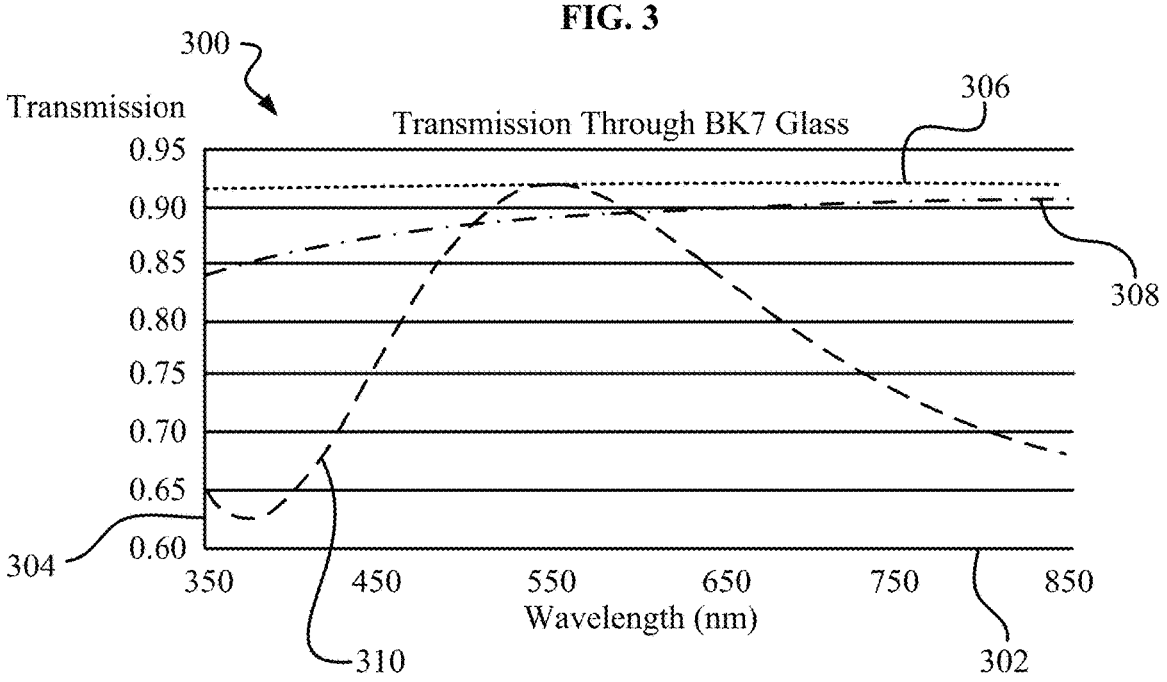
FIG. 3 is a graph showing exemplary wavelength transmissions through a thin film diamond coatings for glass, such as may be fabricated using the method illustrated in FIG. 2.

FIG. 3 is a graph 300 showing exemplary wavelength transmissions through a thin film diamond coatings for glass, such as may be fabricated using method 200. The commercially available optics design software suite, Open Filters, may be utilized to simulate the transmittance of the system 100 and method 200. With respect to growth for glass consumer electronics display materials, work was conducted to intermix optical glass materials with nanocrystalline diamond, optimizing for wavelengths within the visible spectrum. Diamond has a higher index of refraction than commonly utilized glass materials, such as BK7 Glass, thus reducing the transmission through the glass.

Graph 300 includes a horizontal axis 302 illustrating light wavelengths, and a vertical axis 304 illustrating light wave transmission, through a substrate, for example substrate 102, which in this case is a substrate of BK7 glass. Line 306 illustrates transmission at various wavelengths of uncoated BK7 glass. A thin diamond layer of approximately 10 nanometers, such as diamond film 104, may reduce the transmission by approximately two to six percent through the glass, as illustrated by line 308. A thicker layer of approximately 113 nanometers can be optimized to minimize the effect at one wavelength (550 nm), with a larger reduction at other wavelengths, as illustrated by line 310.

In the case of curved or flexed consumer electronics display materials being used as the substrate, for example substrate 201, the process is further detailed. Such curved substrate materials may include camera and sensor lenses. Due to the shape of the lens, there may be variations of thickness in the coating thickness of up to, for example, six percent from the center to the edge of the substrate. This variance in thickness may have an effect on the transmission.

Figure 4:
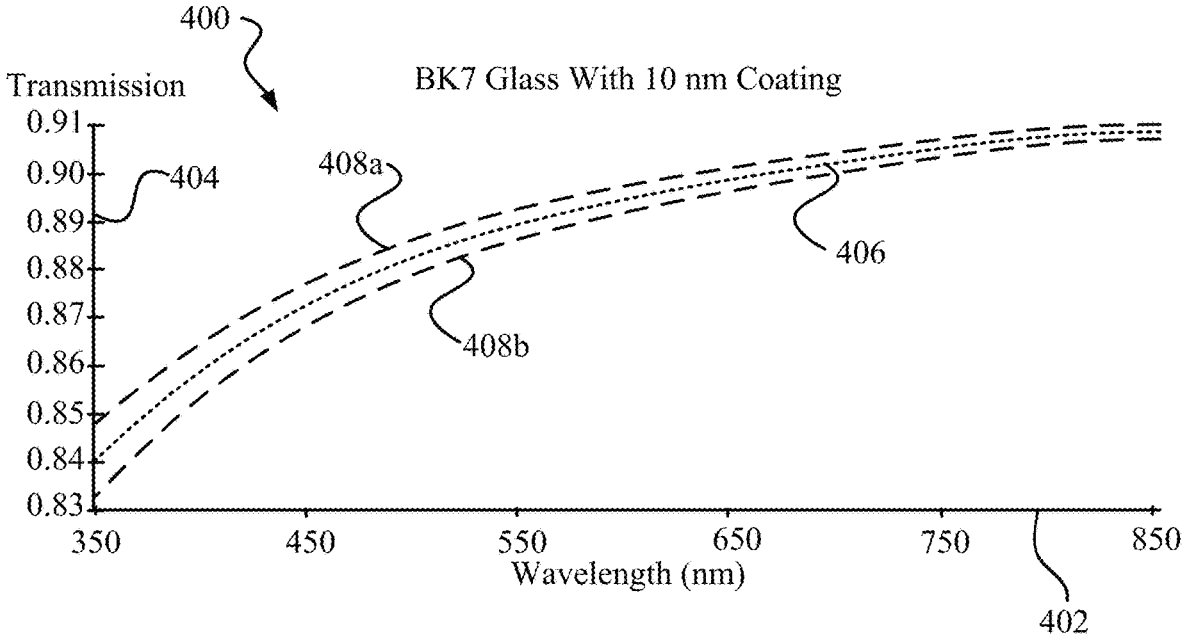
FIG. 4 is a graph showing exemplary wavelength transmissions through a ten nanometer thin film diamond coatings for a glass lens, such as may be fabricated using the method illustrated in FIG. 2.

FIG. 4 is a graph 400 showing exemplary wavelength transmissions through a ten nanometer thin film diamond coatings for a glass lens, such as may be fabricated using the method illustrated in FIG. 2. Graph 400 includes a horizontal axis 402 illustrating light wavelengths, and a vertical axis 404 illustrating light wave transmission, through a substrate, for example substrate 102, which in this case is a substrate of curved BK7 glass. Line 406 illustrates design transmission at various wavelengths of curved. BK7 glass with a ten nanometer diamond film coating. Line 408a and 408b show variances from design that may be found with curved BK7 glass with a ten nanometer diamond film coating.

Figure 5:
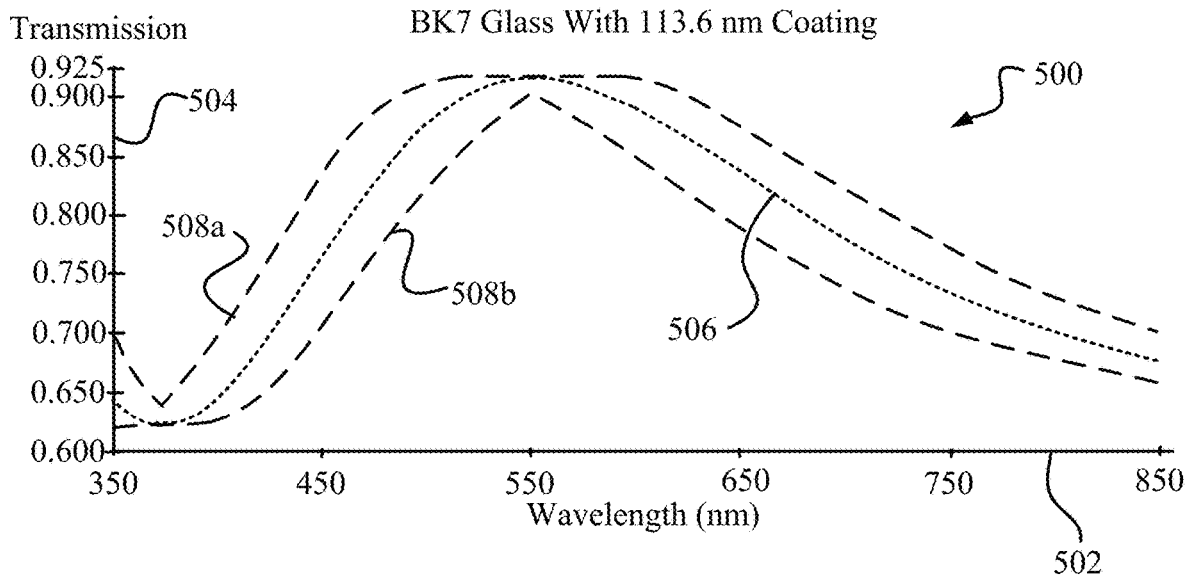
FIG. 5 is a graph showing exemplary wavelength transmissions through a 113.6 nanometer thin film diamond coatings for a glass lens, such as may be fabricated using the method illustrated in FIG. 2.

FIG. 5 is a graph 500 showing exemplary wavelength transmissions through a 113.6 nanometer thin film diamond coatings for a glass lens, such as may be fabricated using the method illustrated in FIG. 2. Graph 500 includes a horizontal axis 502 illustrating light wavelengths, and a vertical axis 504 illustrating light wave transmission, through a substrate, for example substrate 102, which in this case is a substrate of curved. BK7 glass. Line 506 illustrates design transmission at various wavelengths of curved BK7 glass with a 113.6 nanometer diamond film coating. Line 508a and 508b show variances from design that may be found with curved BK7 glass with a 113.6 nanometer diamond film coating.

The effect illustrated in graphs 400 and 500 may be significantly lowered utilizing thinner films, while increased for thicker films. In the embodiments discussed herein, less than one micron nanocrystalline diamond may be monolithically integrated on substrate, such as substrate 102, where the hardness, strength, hydrophobicity, and thermal conductivity of diamond are for the first time realized in consumer electronics display materials.

Structure 100 and method 200 may incorporate systems and methods previously disclosed and described in U.S. Patent Publication No. 2013/0026492, by Adam Khan, published on Jan. 31, 2013, U.S. Pat. No. 8,354,290, issued to Anirudha Sumant, et al, on Jan. 15, 2013; U.S. Pat. No. 8,933,462, issued to Adam Khan on Jan. 13, 2015; U.S. Patent Publication No. 2015/0206749, by Adam Khan, published on Jul. 23, 2015, and U.S. Patent Publication No. 2015/0295134, by Adam Khan, et al, published on Oct. 15, 2015, all of Which are fully incorporated herein by reference.

This disclosure provides several preferred embodiments of fabrication, however, the performance characteristics and materials characteristics described in this application are not necessarily performance bounds or limitations of the invention. These disclosures merely demonstrate some aspects of the invention that have presently been tested.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

We claim:

[1. A transparent glass for electronics, comprising:

a BK7 silicon substrate;

a nanocrystalline diamond film of approximately 113 nm on the BK7 silicon substrate, the diamond film deposited using a chemical vapor deposition system having a reactor in which methane, hydrogen and argon source gases are added wherein the transmission of light through the silicon substrate and the nanocrystalline diamond film at 550 nm wavelength is in excess of 0.90 and the transmission of light between 350 nm and 450 nm wavelength is less than 0.80 and the transmission of light between 750 nm and 850 am is less than 0.80.]

[2. The transparent glass of claim 1, wherein the reactor is a microwave plasma reactor.]

[3. The transparent glass of claim 1, wherein the reactor is a hot filament reactor.]

[4. The transparent glass of claim 1, wherein the substrate is seeded with nanocrystalline diamond prior to the deposition of the diamond film.]

[5. The transparent glass of claim 1, wherein the reactor is operated at temperatures less than 450 degrees Celsius.]

[6. The transparent glass of claim 1, wherein the diamond film is less than on micron.]

[7. The transparent glass of claim 1, wherein the substrate is fused silica.]

[8. The transparent glass of claim 1, wherein the substrate is quartz.]

[9. The transparent glass of claim 1, wherein the substrate includes sapphire.]

[10. The transparent glass of claim 1, wherein the methane, hydrogen and argon source gases are at concentrations of: 300 SCCM argon, 3 SCCM methane), 4 SCCM H2 hydrogen.]

*11. A transparent display comprising:*

*a glass substrate; and*

*a nanocrystalline diamond film formed on the glass substrate, wherein the nanocrystalline diamond film comprises a thickness from about 102 nm to about one micrometer;*

*wherein transmission of light through the glass substrate and the nanocrystalline diamond film is such that:*

*at least 88% of light comprising a wavelength of 550 nm passes through the transparent display;*

*less than 80% of light comprising a wavelength between 350 nm and 450 nm passes through the transparent display; and*

*less than 80% of light comprising a wavelength between 750 nm and 850 nm passes through the transparent display.*

*12. The transparent display of claim 11, wherein the nanocrystalline diamond film is deposited on to the glass substrate with a microwave plasma reactor.*

*13. The transparent display of claim 11, wherein the nanocrystalline diamond film is deposited on to the glass substrate with a hot filament reactor.*

*14. The transparent display of claim 11, wherein the glass substrate is seeded with nanocrystalline diamond prior to the nanocrystalline diamond film being deposited on to the glass substrate.*

*15. The transparent display of claim 11, wherein the nanocrystalline diamond film is deposited on to the glass substrate with a reactor that is operated at temperatures less than 450 degrees Celsius.*

*16. The transparent display of claim 11, wherein the nanocrystalline diamond film comprises a thickness from about 102 nm to about 125 nm.*

*17. The transparent display of claim 11, wherein the glass substrate comprises fused silica.*

*18. The transparent display of claim 11, wherein the glass substrate comprises quartz.*

*19. The transparent display of claim 11, wherein the glass substrate comprises sapphire.*

*20. The transparent display of claim 11, wherein the nanocrystalline diamond film is deposited on to the glass substrate using source gases comprising:*

*methane at a concentration of 3 standard cubic centimeters per minute (SCCM);*

*hydrogen at a concentration of 4 SCCM; and*

*argon at a concentration of 300 SCCM.*

*21. The transparent display of claim 11, wherein the nanocrystalline diamond film comprises a grain size less than one micrometer.*

*22. The transparent display of claim 11, wherein the nanocrystalline diamond film comprises a grain size from about 200 nm to about 300 nm.*

*23. The transparent display of claim 11, wherein the nanocrystalline diamond film comprises a grain size less than or equal to 10 nm.*

* * * * *